United States Patent [19]
Langan

[11] Patent Number: 5,578,928
[45] Date of Patent: Nov. 26, 1996

[54] METHOD FOR DETECTING ZERO CROSSINGS IN A RECTIFIED POWER SIGNAL

[75] Inventor: David A. Langan, Clifton Park, N.Y.

[73] Assignee: General Electric Company, Schenectady, N.Y.

[21] Appl. No.: 376,252

[22] Filed: Jan. 23, 1995

[51] Int. Cl.$^6$ ................................. G01R 31/14
[52] U.S. Cl. ........................... 324/509; 324/772
[58] Field of Search ................... 324/107, 509, 324/772, 545; 361/30, 31, 33, 79, 42

[56] References Cited

U.S. PATENT DOCUMENTS

| | | | |
|---|---|---|---|
| 4,714,878 | 12/1987 | Steinigeweg | 324/772 |
| 4,901,005 | 2/1990 | Shin et al. | 324/107 |
| 5,045,779 | 9/1991 | Herick et al. | 324/772 |
| 5,200,684 | 4/1993 | Fisher | 318/809 |
| 5,239,252 | 8/1993 | Runggaldier et al. | 318/806 |
| 5,241,443 | 8/1993 | Efantis | 324/509 |
| 5,341,080 | 8/1994 | Sanz | 318/778 |
| 5,378,979 | 1/1995 | Lombardi | 324/509 |

*Primary Examiner*—Maura K. Regan
*Attorney, Agent, or Firm*—Marvin Snyder

[57] ABSTRACT

A method for detecting or sensing zero crossings in a rectified power signal comprising three separate signal constituents for energizing a three-phase circuit is provided. The method includes the steps of sampling at least two consecutive cycles of each signal constituent at a predetermined sampling rate; storing a predetermined number of samples for each signal constituent; computing a respective initial zero crossing estimate for each signal constituent; and checking the accuracy of the respective initial zero crossing estimate for each signal constituent of the power signal. If necessary, the method can further include the step of adjusting the initial estimate for the zero crossing of at least one of the three signal constituents of the power signal. In each case, the detected or sensed zero crossings, in turn, enable detection of a ground fault in the three phase circuit.

12 Claims, 8 Drawing Sheets

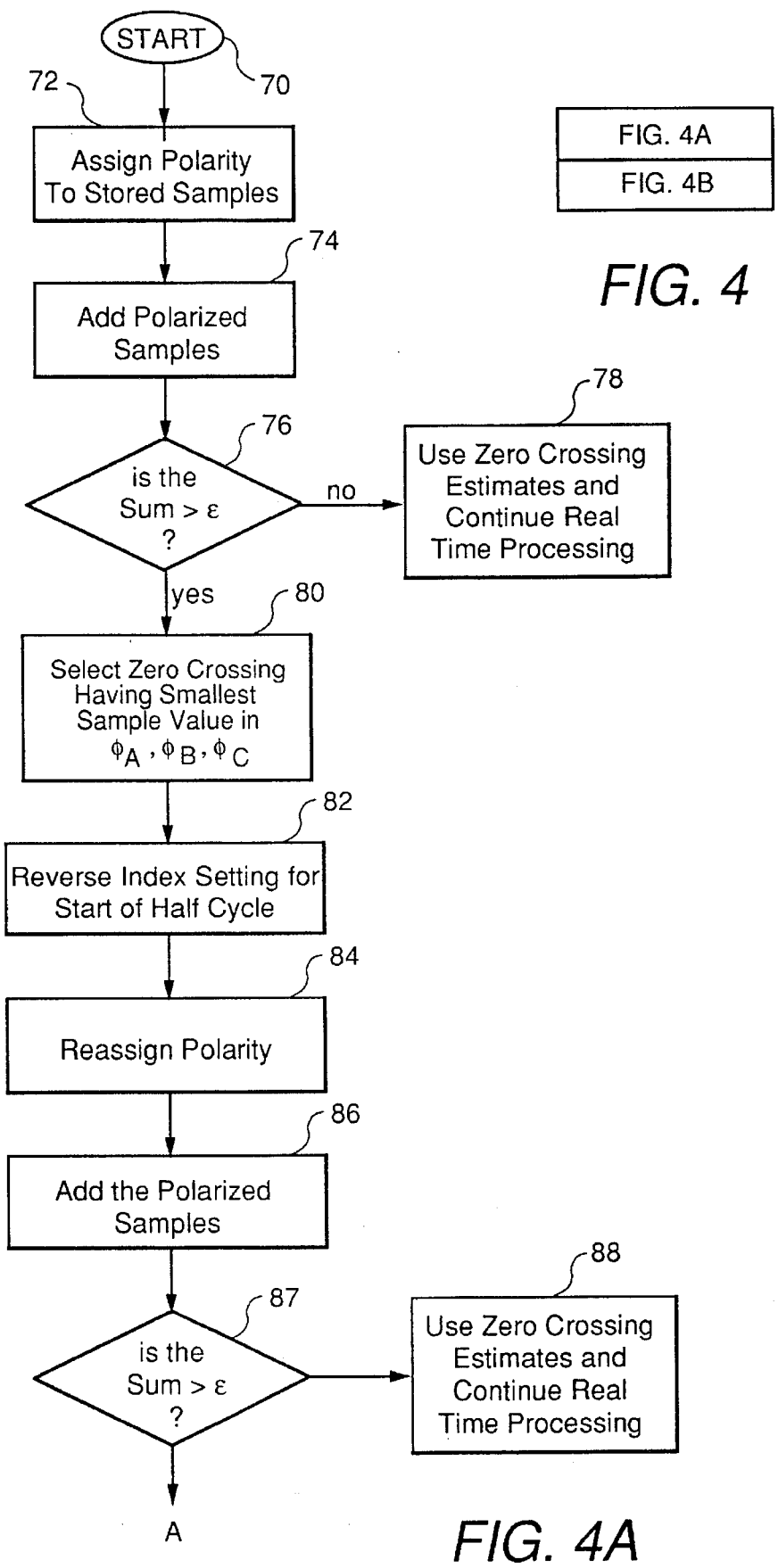

METHOD FOR DETECTING ZERO CROSSINGS IN A RECTIFIED POWER SIGNAL

BACKGROUND OF THE INVENTION

The present invention relates to a method for detecting zero crossings in a power signal and, more particularly, to a method for detecting zero crossings in a rectified power signal for a three-phase circuit so as to enable detection of a ground fault condition in the circuit.

It is desirable to provide accurate and efficient detection of a ground fault condition that can occur in three-phase circuits, such as electric motors and the like. Accurate and efficient detection is desirable to avoid damage to the electric motor. For instance, if the ground fault condition is left uncorrected, any current which substantially exceeds the ampererating of the motor can result in motor temperatures being sufficiently high for damaging or degrading winding insulation. This degradation can eventually cause electrical shorts in the catastrophic failure. The power signal associated with such threephase circuits typically comprises three separate signal constituents, such as three separate sinusoids, each having an electrical phase which is displaced by 120° with respect to one another. In general, when a ground fault occurs at least one of three signal constituents or sinusoids experiences a phase and/or magnitude shift. Thus, it will be appreciated that detection of a ground fault is equivalent to detecting such phase and/or magnitude shift. As will be recognized by those skilled in the art, the sum of three equal magnitude sinusoids offset from one another by 120° in phase is equal to zero. Thus, the presence of a non-zero residual in the sum of the three sinusoids is generally indicative of the ground fault condition. However, since the available power signal is rectified as well as corrupted by third harmonics and other noise sources, monitoring for the ground fault condition through the sum of the three separate sinusoids requires substantially accurate detection of zero crossings in each of the three signal constituents or sinusoids that make up the rectified power signal. In essence, the zero crossing detection is required so that the power signal can be derectified and summed as explained above. Thus, there is a need for an accurate and efficient zero crossings detection method which can be readily performed on a rectified power signal and which is substantially immune to the presence of third harmonics and other noise sources.

SUMMARY OF THE INVENTION

Generally speaking, the present invention fulfills the foregoing needs by providing a method for detecting or sensing zero crossings in a rectified power signal comprising three separate signal constituents for energizing a three-phase circuit. The method includes the steps of sampling at least two consecutive cycles of each signal constituent at a predetermined sampling rate; storing a predetermined number of samples for each signal constituent; computing a respective initial zero crossing estimate for each signal constituent; and checking the accuracy of the respective initial zero crossing estimate for each signal constituent of the power signal. If necessary, the method can further include the step of adjusting the initial estimate for the zero crossing of at least one of the three signal constituents of the power signal. In each case, the detected or sensed zero crossings, in turn, enable detection of a ground fault in the three phase circuit.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like numbers represent like parts throughout the drawings, and in which:

Figure 3:
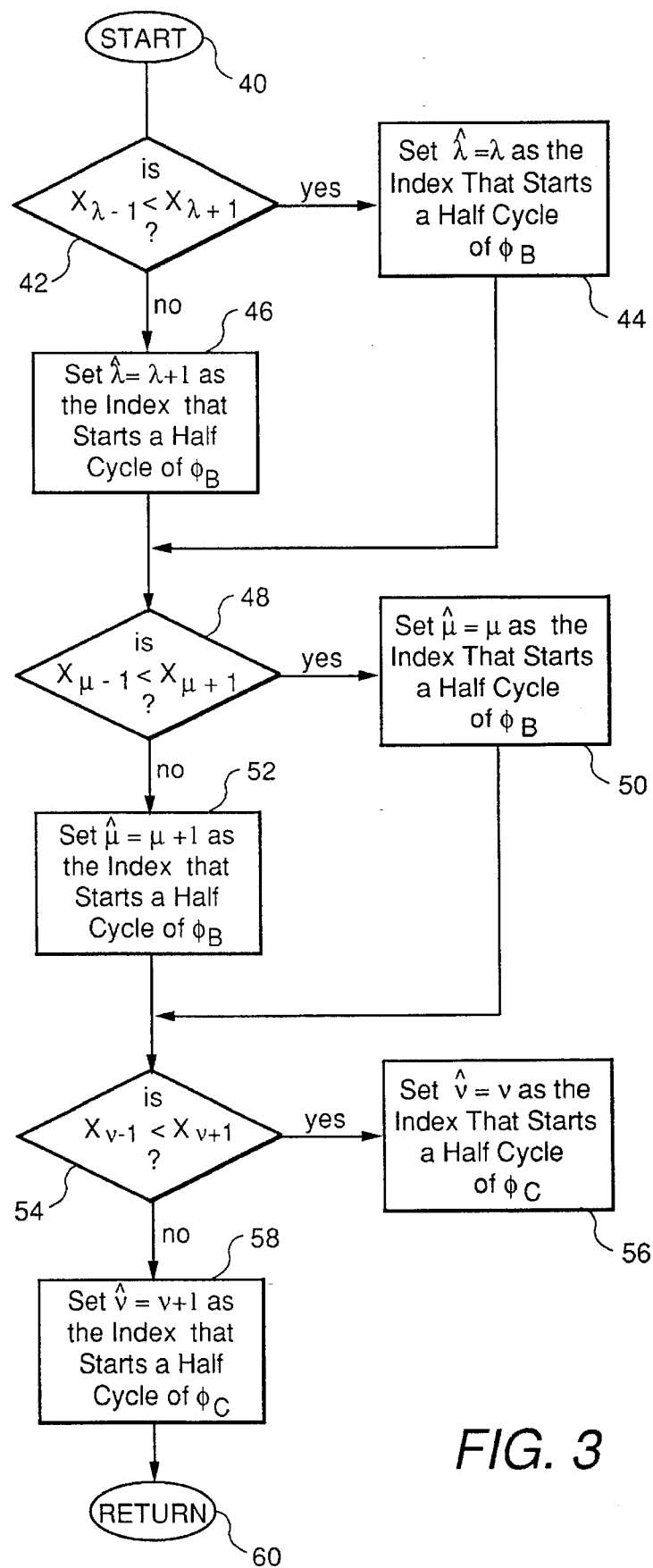
Figure 4B:
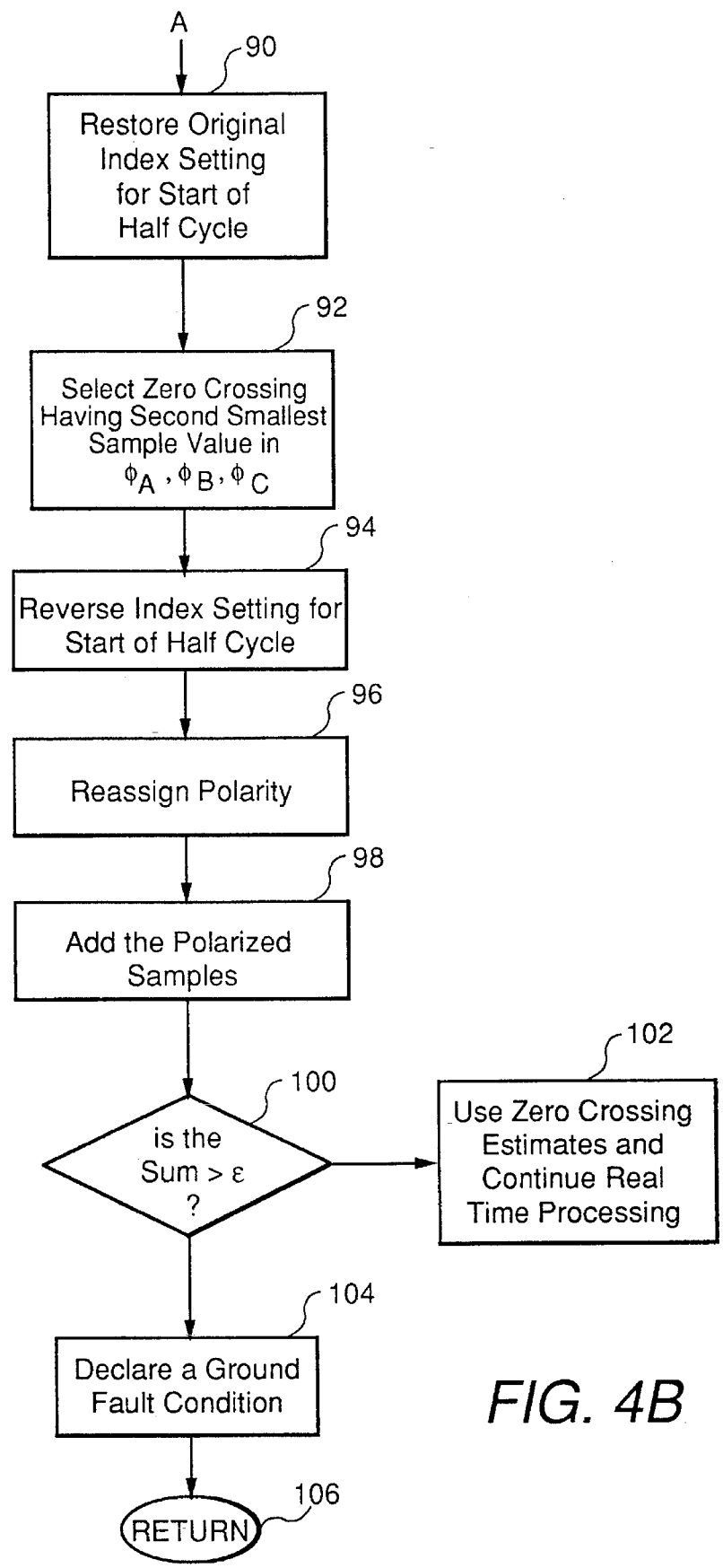
Figures 5, 5A:
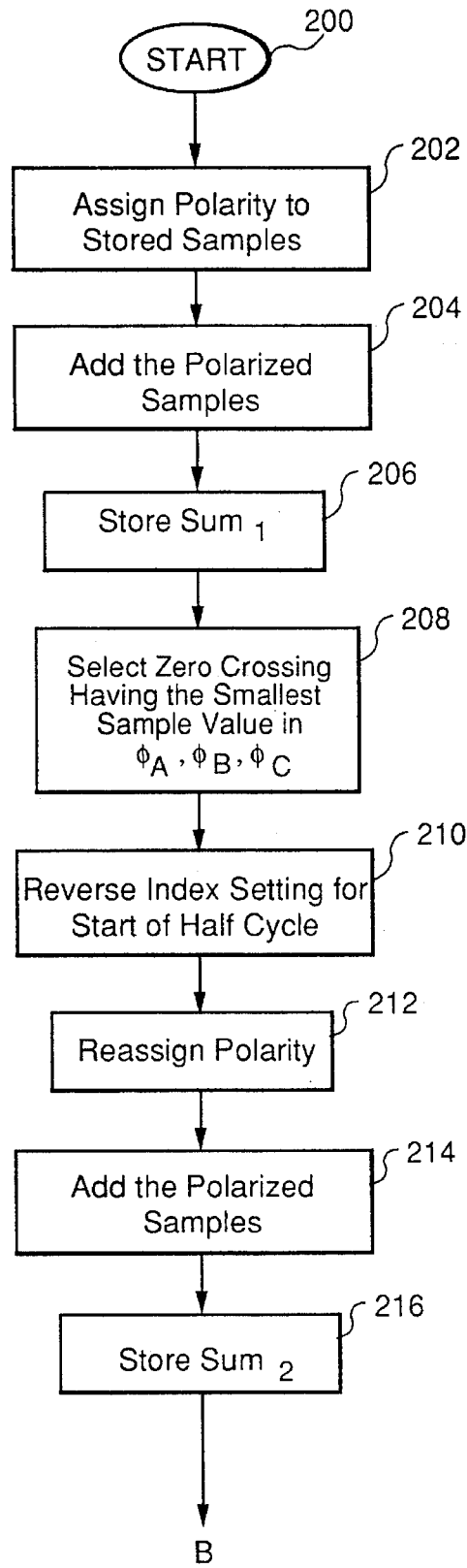
Figure 5B:
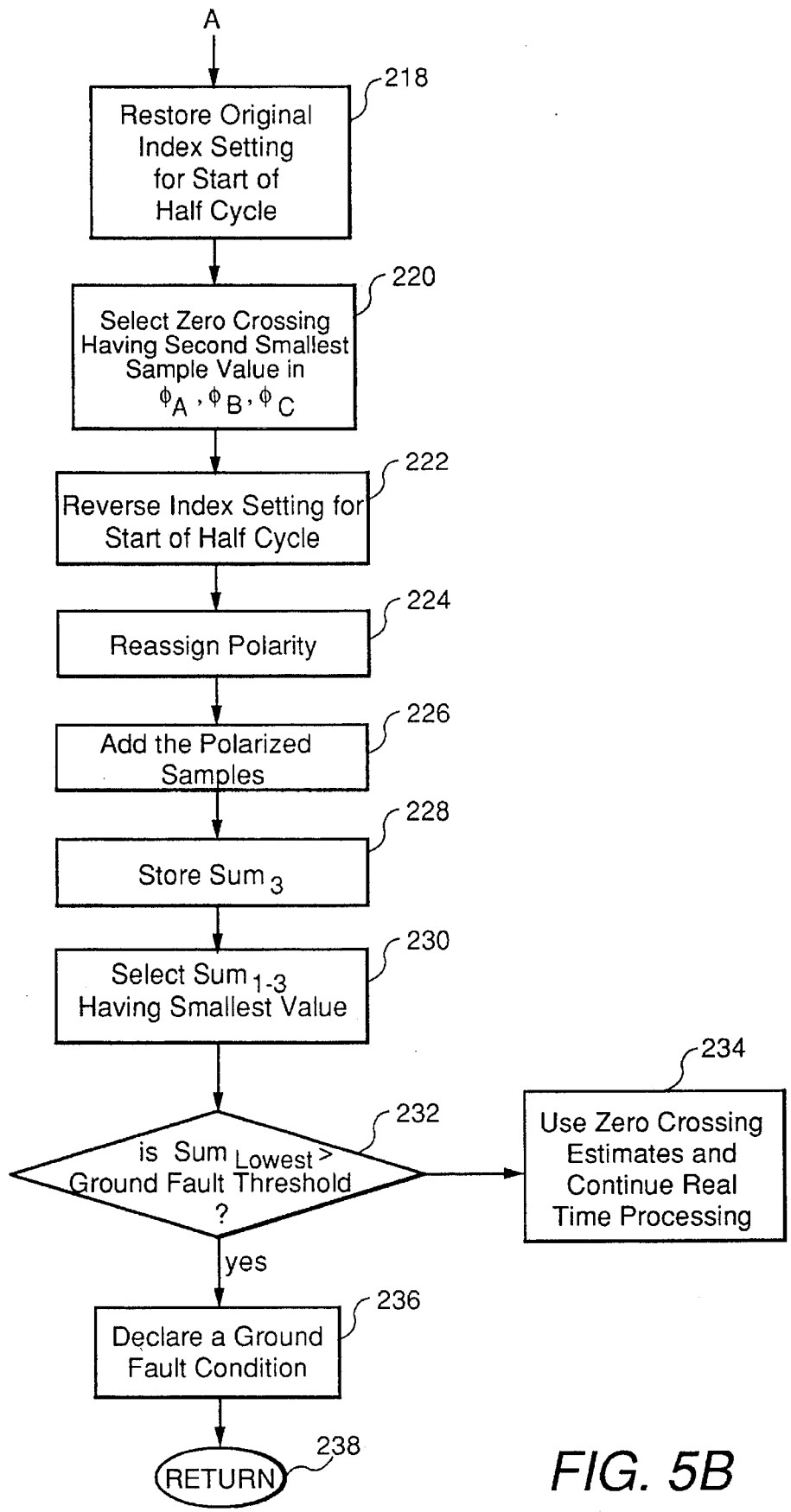
Figure 6A:
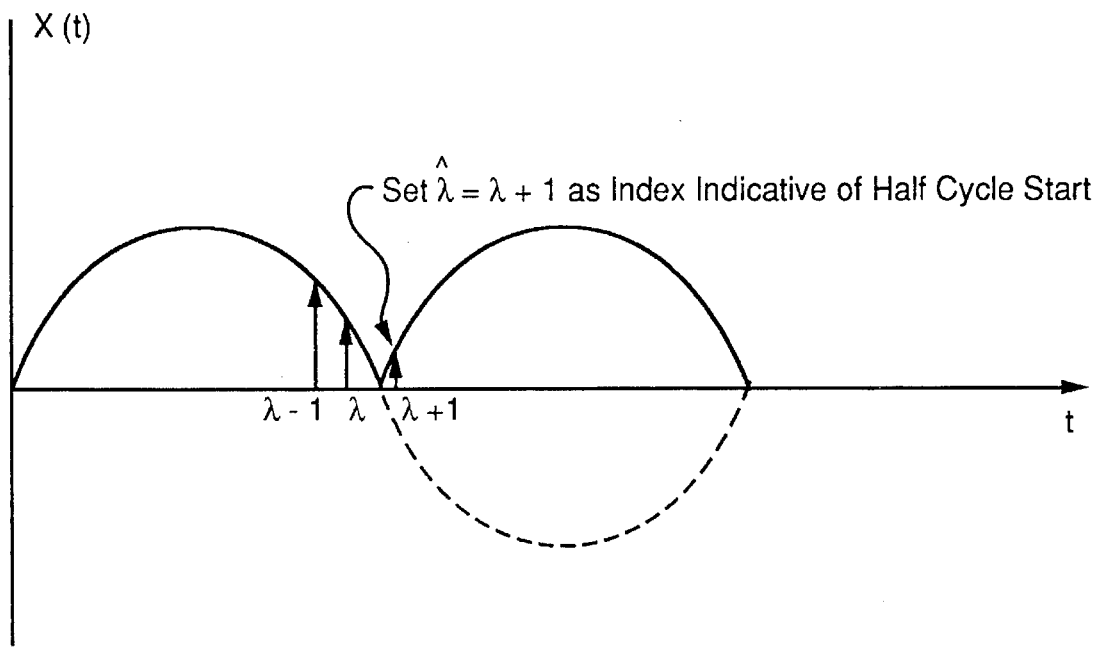
Figure 6B:
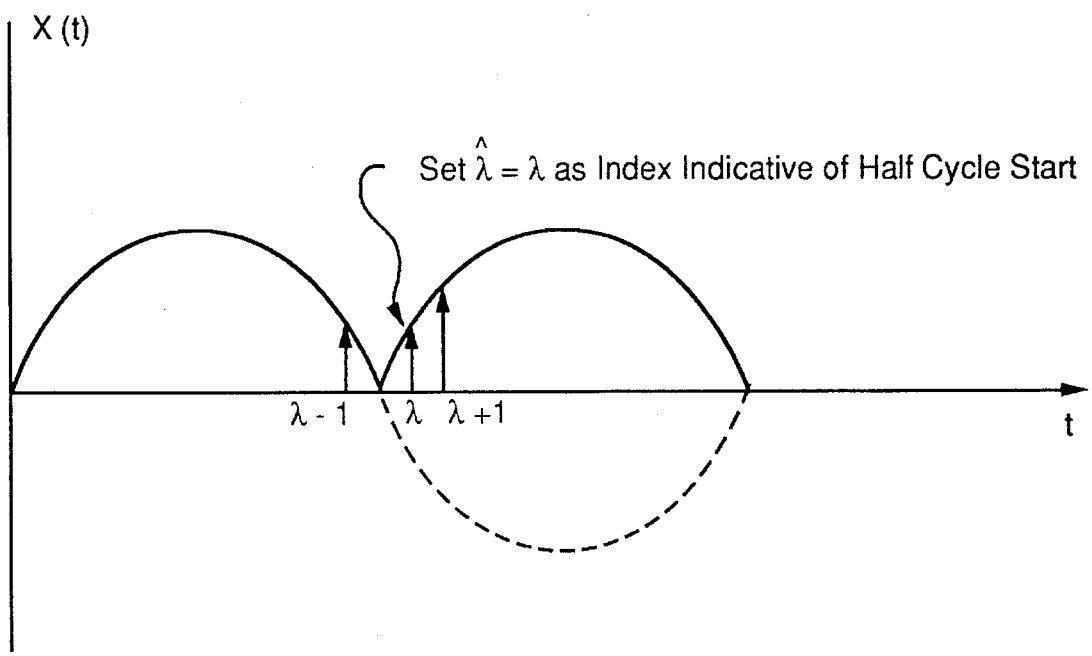

Fig, 2 is a flowchart illustrating a sequence of steps for computing respective initial zero crossing estimates in accordance with the present invention;

FIG. 3 is a flowchart illustrating a sequence of steps for setting a respective index which is indicative of a respective half cycle start in accordance with the present invention;

FIG. 4 is a block diagram showing how FIGS. 4A and 4B are assembled with respect to one another;, FIGS. 4A and 4B constitute a flowchart illustrating a sequence of steps for checking the accuracy of the respective initial zero crossing estimates and for adjusting the initial zero crossing estimates in accordance with one exemplary embodiment of the present invention;

FIG. 5 is a block diagram showing how FIGS. 5A and 5B are assembled with respect to one another, FIGS. 5A and 5B constitute a flow chart illustrating a sequence of steps for checking the accuracy of the respective initial zero crossing estimates and for adjusting the initial zero crossing estimates in accordance with another exemplary embodiment of the present invention; and FIGS. 6A and 6B are respective diagrams for illustrating further details for setting a respective index which is indicative of a respective half cycle start in accordance with the present invention.

DETAILED DESCRIPTION OF THE INVENTION

Figure 1:
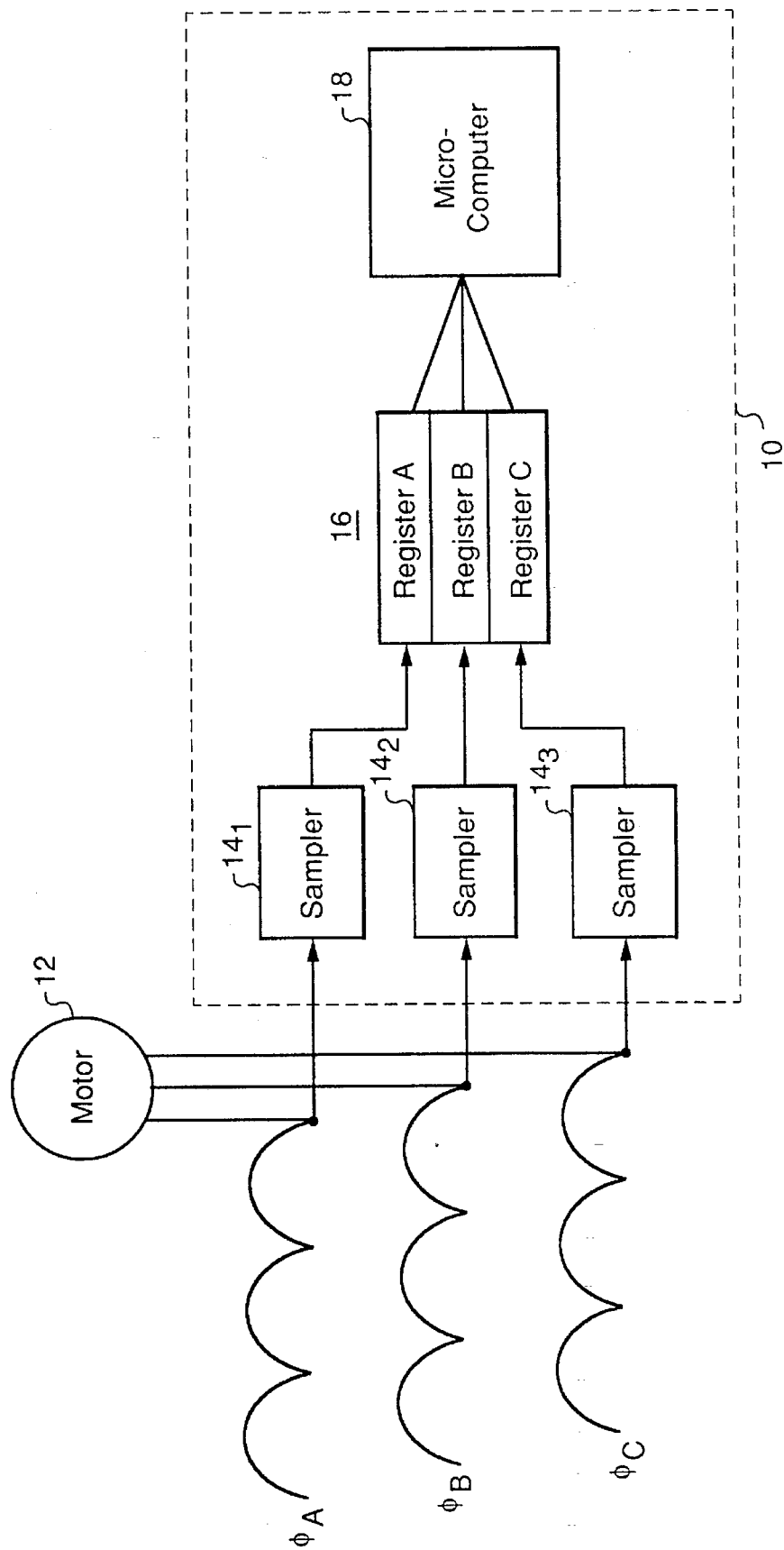
FIG. 1 shows a block diagram schematic of a zero crossing detector using a method in accordance with the present invention.

FIG. 1 shows a zero crossing detector 10 which can be readily employed for detecting a ground fault condition in a three phase circuit, such as an electric motor 12. As shown in FIG. 1, the power signal available to detector 10 is constituted of three separate signal constituents, such as three rectified sinusoids labeled φA, φB, and φC having 120° electrical phase offsets between one another. For example, signal constituent φA can have an electrical phase of 0°, while signal constituents φB and φC can have electrical phases of 120° and 240°, respectively. Although not required, it is assumed that the actual phase assignment for each of the three signal constituents is known a priori. This information conveniently saves processing time being that once a zero crossing is detected for one of the signal constituents, then any subsequently detected zero crossings can be readily assigned to the remaining signal constituents of the power signal. As shown in FIG. 1, respective samplers $14_1$–$14_3$ are used for sampling at least two consecutive cycles of each phase of the rectified power signal at a predetermined sampling rate which at least satisfies the Nyquist sampling rate. For example, for a power signal having a frequency of 60 Hz, a sampling rate of 480 Hz can be conveniently chosen. At this exemplary sampling rate, a number of eight samples per cycle is obtained for each of the signal constituents of the power signal. Thus, if three consecutive cycles are sampled, then a total number of 24 samples are obtained for each signal constituent of the power signal, or 72 samples for the three signal constituents of the power signal. As further shown in FIG. 1, a bank of registers 16 is used for storing a predetermined number of samples for each signal constituent of the power signal. For example, register A, register B and register C are used for storing the samples from signal constituents φA, φB, and φC, respectively. As will be explained shortly hereafter, a microcomputer 18 or similar computing device is coupled to registers 16 to receive the respective samples stored therein so as to compute and adjust zero crossings estimates which, in turn, enable detection of a ground fault condition in motor 12.

Figure 2:
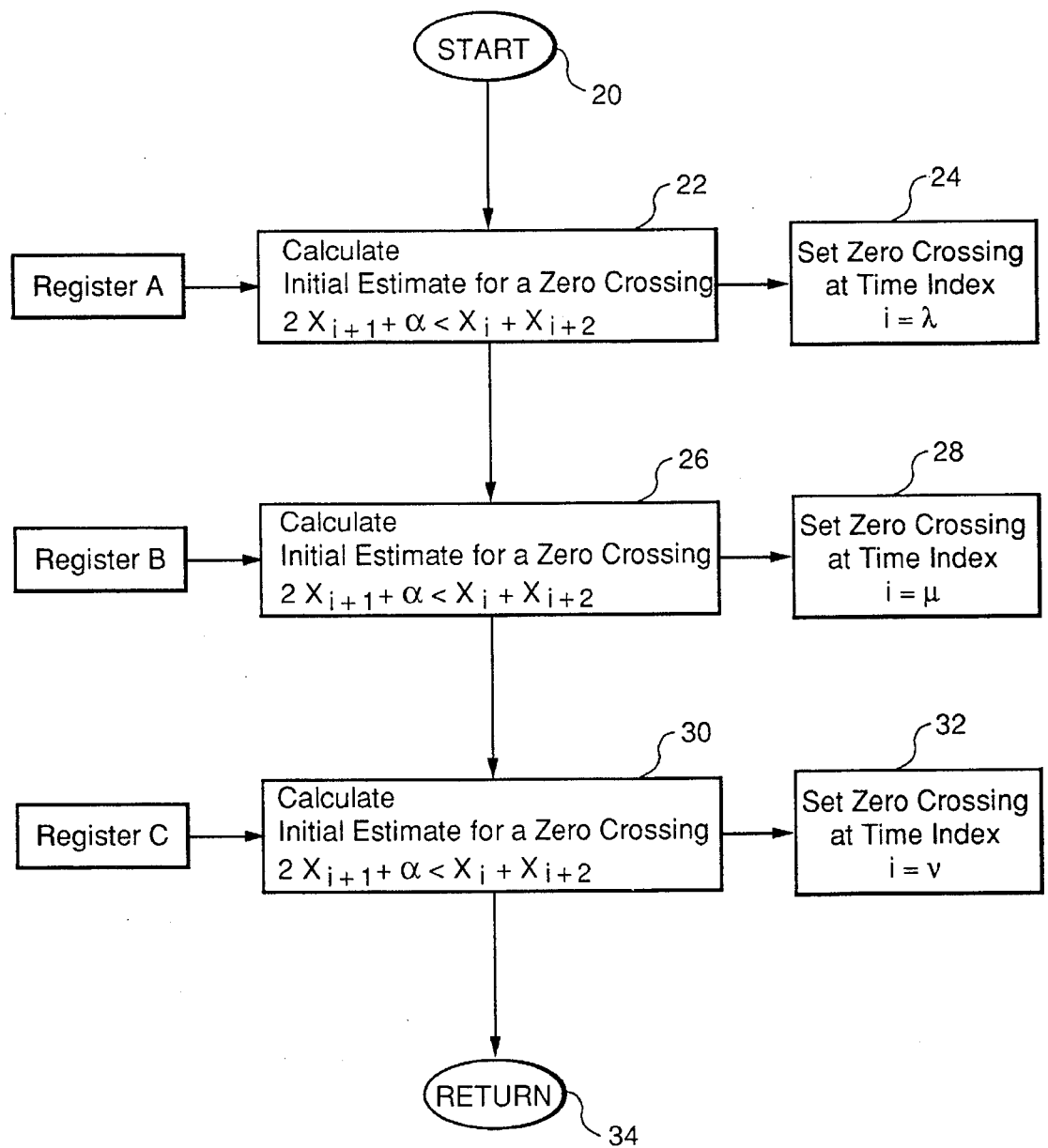

FIG. 2 is a flowchart that illustrates a sequence of steps for computing a respective initial zero crossing estimate for each of the signal constituents of the power signal. After start of operations in step 20, step 22 allows for computing a respective initial zero crossing estimate using the samples stored in register A which correspond to signal constituent φA. In this case, a search is performed to find three consecutive samples in signal constituent φA so that a middle sample of the three consecutive samples has a respective sample value which is less than the respective sample values of the two remaining outer samples and satisfy $$2x(i+1)+\alpha < x(i)+x(i+2) \qquad \text{Eq. 1,}$$

where $x(i+1)$ represents the sample value of the middle sample at time $i+1$, $x(i)$ and $x(i+2)$ represent sample values for the two remaining samples at times $i$ and $i+2$, respectively, and $\alpha$ is a predetermined constant. Step 24 allows for setting an initial zero crossing estimate at time index $i=\lambda$ for signal constituent φA of the power signal.

Step 26 allows for computing a respective initial zero crossing estimate using the samples stored in register B which correspond to signal constituent φB. Again, a search is performed to find three consecutive samples in signal constituent φB so that a middle sample of the three consecutive samples has a respective sample value which is less than the respective sample values of the two remaining samples and additionally satisfy Eq. 1. Step 28 allows for setting an initial zero crossing estimate at time index $i=\mu$ for signal constituent φB. Similarly, prior to end of operations in step 40, steps 30 and 32 allow for computing a respective initial zero crossing estimate using the samples stored in register C which correspond to signal constituent φC and for setting an initial zero crossing estimate at time index $i=v$ for signal constituent φC of the power signal. It will be appreciated by those skilled in the art that for the exemplary phase assignment described above (i.e., for signal constituents φA, φB, and φC having electrical phases of 0°, 120° and 240°, respectively), index $\mu$ is subsequent in time relative to index $\lambda$, and index $v$ is subsequent in time relative to index $v$.

FIG. 3 is a flowchart illustrating a sequence of steps for setting a respective index which is indicative of a respective half cycle start for each of the signal constituents of the power signal. After start of operations in step 40, comparison step 42 allows for setting an index indicative of a half cycle start in signal constituent φA. For example, if the sample value of $x\lambda-1 < x\lambda+1$ then in step 44, $\lambda$ is chosen as the index indicative for the half cycle start of signal constituent φA, otherwise, in step 46, $\lambda+1$ is chosen as the index indicative for the half cycle start of signal constituent φA.

FIG. 6A is an exemplary diagram that conceptually illustrates a situation where $\lambda+1$ is set as the index indicative for a half cycle start, whereas FIG. 6B is another exemplary diagram that conceptually illustrates a situation where $\lambda$ is set as the index indicative for the half cycle start. As used herein the expression half cycle refers to any of the two half cycles that together define a full cycle in a sinusoid. An accurate index setting is desirable for the start of any half cycle, otherwise samples that belong to a negative half cycle, represented by the dashed line, can be incorrectly assigned to a positive half cycle, or, alternatively, samples that belong to a positive half cycle can be incorrectly assigned to a negative half cycle. Returning to FIG. 3, comparison step 48, similarly to comparison step 42, allows for setting the index indicative of a half cycle start of signal constituent φB. Depending on the comparison result, either index $\mu$ is set as the index indicative of the half cycle start of signal constituent φB in step 50, or index $\mu+1$ is set in step 52 as the index indicative of the half cycle start of signal constituent φB. Similarly, comparison step 54 allows for setting the index indicative of a half cycle start of signal constituent φC. Again, depending on the comparison result of step 54, prior to end of operations in step 60, either index $v$ is set as the index indicative of the half cycle start of signal constituent φC in step 56, or index $v+1$ is set in step 58 as the index indicative of the half cycle start of signal constituent φC.

FIGS. 4A and 4B constitute a flowchart illustrating a sequence of steps for checking the accuracy of the respective initial zero crossing estimates and for adjusting, if necessary, the initial zero crossing estimates. As previously suggested, the presence of third harmonics and other noise sources and/or sampling errors can affect the accuracy of the respective initial zero crossing estimates and thus one of the advantages of the present invention is to be able to adjust or compensate for inaccuracies introduced by such noise sources and/or sampling errors. After start of operations in step 70, step 72 allows for assigning respective polarities or signs to the samples stored in registers 16 (FIG. 1) based on the respective indexes indicative of each respective half cycle start for each of the three signal constituents of the power signal. For example, samples in each consecutive half cycle will have respective alternating polarities 0 or signs so as to form the two half cycles that form a full cycle in a sinusoid, that is, a positive half cycle and a negative haft cycle. It will be appreciated by those skilled in the art, that step 72, in essence, allows for derectifying each of the three signal constituents that make up the rectified power signal available to zero crossing detector 10 (FIG. 1). Step 74 allows for adding the polarized or signed samples for each of the three signal constituents of the power signal.

As previously suggested, a nonzero residual can be indicative of a ground fault condition in motor 12 (FIG. 1). Step 76 allows for comparing the sum of the polarized samples against a predetermined threshold parameter $\epsilon$. If the sum is less than $\epsilon$, then step 78 uses or accepts the zero crossing estimates so as to continue any further real time processing of the power signal. Otherwise, step 80 allows for adjusting the initial estimate for the zero crossing of at least one of the three signal constituents of the power signal. In particular, step 80 allows for selecting the initial zero crossing estimate having the smallest sample value among the three signal constituents of the power signal. Step 82 allows for reversing the index setting indicative of the half cycle start for the signal constituent corresponding to the selected zero crossing estimate having the smallest sample value. This zero crossing is selected since it can be shown that the largest probability of ambiguity is associated with the zero crossing estimate having the smallest sample value. For example, if signal constituent φA had the lowest zero crossing estimate, and if $\lambda+1$ had been originally set as the index indicative for the half cycle start of φA, then λ would be set as the index indicative for the half cycle start of φA in lieu of index λ+1. Step 84 allows for reassigning respective polarities to the stored samples based on the reversed index setting provided in step 82. Steps 86 allows for adding the polarized or signed samples for each of the three signal constituents of the power signal. Step 87 allows for comparing the sum of the polarized samples from step 86 against threshold parameter ε. If the sum is less than ε, then step 88 uses or accepts the zero crossing estimates to continue any further real time processing of the power signal. Otherwise, the flowchart continues at A for adjusting the initial estimate for the zero crossing of at least an additional one of the three signal constituents of the power signal. Step 90 allows for restoring or resetting the original index setting indicative of the half cycle start for the signal constituent corresponding to the selected crossing estimate having the smallest sample value. Based on the example given above, index λ+1 would be restored in lieu of index λ as the index indicative of the haft cycle start for signal constituent φA. Step 92 allows for selecting the initial zero crossing estimate having the second smallest sample value among the three signal constituents of the power signal. Step 94 allows for reversing the index setting indicative of the half cycle start for the signal constituent corresponding to the selected zero crossing estimate having the second smallest sample value. This zero crossing. is selected since it can be shown that the second largest probability of ambiguity is associated with the zero crossing estimate having the second smallest sample value among the three signal constituents. For example, if signal constituent φB had the second lowest zero crossing estimate, and if index μ+1 had been originally set as the index indicative for the half cycle start of signal constituent φB, then index μ would be set as the index indicative for the half cycle start of signal constituent φB in lieu of index μ+1. Step 96 allows for reassigning respective polarities to the stored samples based on the reversed index setting from step 94. Step 98 allows for adding the polarized or signed samples for each of the three signal constituents of the power signal. Step 100 allows for comparing the sum of the polarized samples from step 98 against threshold parameter ε. If the sum is less than ε, then step 102 uses or accepts the zero crossing estimates to continue any further real time processing of the power signal. Otherwise, step 104 allows for declaring a ground fault condition in motor 12 (FIG. 1) prior to end of operations in step 106. It will be appreciated that threshold parameter e may vary depending on the specific application and thus threshold parameter ε preferably comprises a programmable threshold parameter.

FIGS. 5A and 5B show a flow chart illustrating a sequence of steps for checking the accuracy of the respective initial zero crossing estimates and for adjusting the initial zero crossing estimates in accordance with another exemplary embodiment of the present invention. In this embodiment, instead of separately comparing the respective sums or residuals against a predetermined threshold parameter ε, each sum is stored and then the lowest stored sum or residuals are compared against a ground fault threshold. After start of operations in step 200, steps 202 and 204 are equivalent to steps 72 and 74 described in the context of FIGS. 4A and 4B. As previously suggested, a first sum from step 206 is stored, instead of being compared against threshold parameter ε. Similarly, it will be understood that respective steps 208, 210, 212 and 214 are essentially equivalent to respective steps 80, 82, 84 and 86 described in the context of FIGS. 4A and 4B. However, in this alternative embodiment, a second sum from step 216 is stored, instead of being compared against threshold parameter ε. Similarly, it will be understood that respective steps 218, 220, 222, 224 and 226 are equivalent to respective steps 90, 2, 94, 96 and 98 described in the context of FIGS. 4A and 4B. However, in this alternative embodiment, a third sum from step 228 is stored, instead of being compared against threshold parameter ε. Step 230 allows for selecting the sum having the smallest value of the three stored sums. Comparison step 232 allows for comparing the selected lowest sum against a predetermined ground fault threshold. If the selected lowest sum is less than the ground fault threshold, then step 234 allows for using or accepting the zero crossing estimates prior to end of operations in step 238. Otherwise, a ground fault condition is detected and declared in step 236 prior to end of operations in step 238. In each case, the present invention has been shown to produce substantially accurate results over the signal range of interest even when using a sample resolution of just two bits.

Appendix I contains computer source code listings which may be utilized to control operation of a microcomputer in accordance with the present method for detecting zero crossings in a rectified power signal. The code as written may be executed by a Sun Workstation, for example.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

APPENDIX 1

SOURCE CODE LISTING

```
;*****************************************************
;    function: find_0cross.pro
;
;    revision history:
;    04/19/94      D. Langan - created
;
;***************************************************** function find_0cross, rect_3phase, $
                      max_error = max_error, $
pred_start = pred_start, $
                      sig_adjust = sig_adjust if (n_params() eq 0) then begin
  print, 'usage: sample_start = find_0cross(rectified_3phase)'
  print, '             KEYWORDS: max_error, pred_start, sig_adjust'
  return, 0
endif pred_start = lonarr(3)
period_start = lonarr(3)
low_index = lonarr(3)
low_index(0) = 1
low_deg_est = fltarr(3)
threshold = 0.3
sig_adjust = 0

; ********** find 0 cross for phase 0 *************
done = 0
while not(done) do begin
  if ((rect_3phase(low_index(0)-1,0) ge rect_3phase(low_index(0),0)) $
      and (rect_3phase(low_index(0)+1,0) ge rect_3phase(low_index(0),0))) $
    then begin
      diff = (rect_3phase(low_index(0)-1,0) + rect_3phase(low_index(0)+1,0)) $
```

```
                - 2.0 * rect_3phase(low_index(0),0)
        ; must consider p0_offset = ~25 deg.
        if ((diff ge threshold) or $
            (abs(rect_3phase(low_index(0),0)-0.48) lt
   0.02)) then $
            done = 1
        ; can get screwed by finite word effects
        ; if 2 values equal they will be latter 2 of
   triplet...
        if (rect_3phase(low_index(0),0) eq
   rect_3phase(low_index(0)+1,0)) $
            then begin
            if (rect_3phase(low_index(0)-1,0) gt
   rect_3phase(low_index(0)+2,0)) $
               then low_index(0) = low_index(0) + 1
            done = 1
         endif
       endif
         if not(done) then $
            low_index(0) = low_index(0) + 1
   endwhile print, 'FIND_0CROSS: low_index(0) = ', low_index(0)
   print, 'FIND_0CROSS: phase 0 triplet = ', $
         rect_3phase(low_index(0)-1:low_index(0)+1,0)

; approximate degrees of "low" sample
   ; linear approximation to sin from 0->45 deg.  m =
   45/0.707
   low_deg_est(0) = 63.65 * rect_3phase(low_index(0),0)

; determine if "low" sample occurs before, at, or
   after 0 crossing
   if (rect_3phase(low_index(0)-1,0) gt $
       rect_3phase(low_index(0)+1,0)) then $
     low_deg_est(0) = -low_deg_est(0)

; take care of 3rd order harmonic for case where
   sample at 0 crossing
   if (abs(rect_3phase(low_index(0)-1,0) - $
       rect_3phase(low_index(0)+1,0)) lt 0.01) then $
     low_deg_est(0) = 0 if (low_deg_est(0) lt 0) then $
      period_start(0) = low_index(0) + 1 $
   else $
      period_start(0) = low_index(0)
```

```
     pred_start(0) = period_start(0)
     print, 'FIND_OCROSS: low_index(0) degree est = ',
     low_deg_est(0)
 5   print, 'FIND_OCROSS: period_start(0) = ',
     period_start(0)
     print, 'FIND_OCROSS:
     ******************************************'

10   ;**** given info of phase 0, find phase 1 and phase 2
     zero crossings *****

; ********* phase 1 **********

15   ; prediction
     pred_idx = (180.0 - low_deg_est(0)-120.0)/45.0 +
     low_index(0)
     if ((pred_idx-fix(pred_idx)) gt 0.5) then $
        pred_start(1) = fix(pred_idx) + 1 $
20   else $
        pred_start(1) = fix(pred_idx)

print, 'FIND_OCROSS: predict phase 1 0cross, period
     start: ', pred_idx, $
25           pred_start(1)

low_index(1) = low_index(0) + 1
     done = 0
     while not(done) do begin
30      if ((rect_3phase(low_index(1)-1,1) ge
     rect_3phase(low_index(1),1)) $
           and (rect_3phase(low_index(1)+1,1) ge
     rect_3phase(low_index(1),1))) $
           then begin
35         diff = (rect_3phase(low_index(1)-1,1) +
     rect_3phase(low_index(1)+1,1)) $
                - 2.0 * rect_3phase(low_index(1),1)
           if ((diff ge threshold) or $
              (abs(rect_3phase(low_index(1),1)-0.48) lt
40   0.02)) then $
              done = 1
           ; can get screwed by finite word effects
           ; if 2 values equal they will be latter 2 of
     triplet...
45         if (rect_3phase(low_index(1),1) eq
     rect_3phase(low_index(1)+1,1)) $
              then begin
```

```
              if (rect_3phase(low_index(1)-1,1) gt
      rect_3phase(low_index(1)+2,1)) $
                then low_index(1) = low_index(1) + 1
                done = 1
            endif
          endif
            if not(done) then $
                low_index(1) = low_index(1) + 1
      endwhile print, 'FIND_OCROSS: low_index(1) = ', low_index(1)

; approximate degrees of "low" sample
      ; linear approximation to sin from 0->45 deg.  m =
      45/0.707
      low_deg_est(1) = 63.65 * rect_3phase(low_index(1),1)

; determine if "low" sample occurs before, at, or
      after 0 crossing
      if (rect_3phase(low_index(1)-1,1) gt $
            rect_3phase(low_index(1)+1,1)) then $
        low_deg_est(1) = -low_deg_est(1)

; take care of 3rd order harmonic for case where
      sample at 0 crossing
      if (abs(rect_3phase(low_index(1)-1,1) - $
            rect_3phase(low_index(1)+1,1)) lt 0.01) then $
        low_deg_est(1) = 0 if (low_deg_est(1) lt 0) then $
        period_start(1) = low_index(1) + 1 $
      else $
        period_start(1) = low_index(1)

print, 'FIND_OCROSS: low_index(1) degree est = ',
      low_deg_est(1)
      print, 'FIND_OCROSS: period_start(1) = ',
      period_start(1)
      print, 'FIND_OCROSS:
      ****************************************'

; *************** Phase 2 ***********************

; prediction
```

```
    pred_idx = (360.0 - low_deg_est(0)-240)/45.0 +
    low_index(0)
    if ((pred_idx-fix(pred_idx)) gt 0.5) then $
       pred_start(2) = fix(pred_idx) + 1 $
 5  else $
       pred_start(2) = fix(pred_idx)

print, 'FIND_OCROSS: predict phase 2 Ocross, period
    start: ', pred_idx, $
10            pred_start(2)

low_index(2) = low_index(0) + 1
    done = 0
    while not(done) do begin
15     if ((rect_3phase(low_index(2)-1,2) ge
    rect_3phase(low_index(2),2)) $
          and (rect_3phase(low_index(2)+1,2) ge
    rect_3phase(low_index(2),2))) $
       then begin
20        diff = (rect_3phase(low_index(2)-1,2) +
    rect_3phase(low_index(2)+1,2)) $
              - 2.0 * rect_3phase(low_index(2),2)
          if ((diff ge threshold) or $
              (abs(rect_3phase(low_index(2),2)-0.48) lt
25  0.02)) then $
             done = 1
          ; can get screwed by finite word effects
          ; if 2 values equal they will be latter 2 of
    triplet...
30        if (rect_3phase(low_index(2),2) eq
    rect_3phase(low_index(2)+1,2)) $
          then begin
             if (rect_3phase(low_index(2)-1,2) gt
    rect_3phase(low_index(2)+2,2)) $
35           then low_index(2) = low_index(2) + 1
             done = 1
          endif
       endif
       if not(done) then $
40        low_index(2) = low_index(2) + 1
    endwhile print, 'FIND_OCROSS: low_index(2) = ', low_index(2)

45
    ; approximate degrees of "low" sample
```

```
; linear approximation to sin from 0->45 deg.  m =
45/0.707
low_deg_est(2) = 63.65 * rect_3phase(low_index(2),2)

; determine if "low" sample occurs before, at, or
after 0 crossing
if (rect_3phase(low_index(2)-1,2) gt $
    rect_3phase(low_index(2)+1,2)) then $
  low_deg_est(2) = -low_deg_est(2)

; take care of 3rd order harmonic for case where
sample at 0 crossing
if (abs(rect_3phase(low_index(2)-1,2) - $
    rect_3phase(low_index(2)+1,2)) lt 0.01) then $
  low_deg_est(2) = 0 if (low_deg_est(2) lt 0) then $
  period_start(2) = low_index(2) + 1 $
else $
  period_start(2) = low_index(2)

print, 'FIND_0CROSS: low_index(2) degree est = ',
low_deg_est(2)
print, 'FIND_0CROSS: period_start(2) = ',
period_start(2)
print, 'FIND_0CROSS:
****************************************'

;*************** check to make sure correct
************** max_error_threshold = 0.05
sav_max_error1 = 10
sav_max_error2 = 10
sav_period_start = period_start
sum = sum_3phase(rect_3phase(0:60,*), period_start)
sum = sum(10:50)
max_error = max(abs(sum))
orig_max_error = max_error
print, 'FIND_0CROSS: maximum sum error: ', max_error
if (max_error gt max_error_threshold) then begin
    print, 'FIND_0CROSS: uh oh, didnt pass - adjust 0
crossings'
    sig_adjust = 1
    min_idx = where(abs(low_deg_est) eq
min(abs(low_deg_est)))
    min_idx = min_idx(0)
```

```
       print, 'FIND_OCROSS: adusting phase ', min_idx
       if (low_deg_est(min_idx) lt 0) then $
          period_start(min_idx) = period_start(min_idx) - 1
    $
 5     else $
          period_start(min_idx) = period_start(min_idx) + 1
       sum = sum_3phase(rect_3phase(0:60,*), period_start)
       sum = sum(10:50)
       max_error = max(abs(sum))
10     sav_period1_start = period_start
       sav_max_error1 = max_error
       print, 'FIND_OCROSS: maximum sum error: ', max_error
    endif
    if (max_error gt max_error_threshold) then begin
15     print, 'FIND_OCROSS: uh oh, didnt pass - adjust 0
    crossings'
       period_start = sav_period_start
       mid_idx = where((abs(low_deg_est) gt
    min(abs(low_deg_est))) and $
20                    (abs(low_deg_est) lt
    max(abs(low_deg_est))))
       mid_idx = mid_idx(0)
       if (mid_idx eq -1) then begin
          mid_idx = where(abs(low_deg_est) eq
25     min(abs(low_deg_est)))
          if (n_elements(mid_idx) gt 1) then begin
             mid_idx = mid_idx(1)
          endif else begin
             mid_idx = where(abs(low_deg_est) ne
30     min(abs(low_deg_est)))
             mid_idx = mid_idx(0)
          endelse
       endif
       print, 'FIND_OCROSS: adusting phase ', mid_idx
35     if (low_deg_est(mid_idx) lt 0) then $
          period_start(mid_idx) = period_start(mid_idx) - 1
    $
       else $
          period_start(mid_idx) = period_start(mid_idx) + 1
40     sum = sum_3phase(rect_3phase(0:60,*), period_start)
       sum = sum(10:50)
       max_error = max(abs(sum))
       sav_period2_start = period_start
       sav_max_error2 = max_error
45     print, 'FIND_OCROSS: maximum sum error: ', max_error
    endif
    ; are things worse
```

```
       if (orig_max_error lt max_error) then begin
          print, 'FIND_0CROSS: heck leave it alone!'
          period_start = sav_period_start
          max_error = orig_max_error
 5        sig_adjust = 0
          print, 'FIND_0CROSS: maximum sum error: ', max_error
       endif v = [orig_max_error, sav_max_error1, sav_max_error2]
10     min_idx = where(v eq min(v))
       case min_idx(0) of
          0: begin
                period_start = sav_period_start
                max_error = orig_max_error
15              sig_adjust = 0
             end
          1: begin
                period_start = sav_period1_start
                max_error = sav_max_error1
20              sig_adjust = 1
             end
          2: begin
                period_start = sav_period2_start
                max_error = sav_max_error2
25              sig_adjust = 1
             end
         -1: begin
                period_start = sav_period_start
                max_error = orig_max_error
30              sig_adjust = 0
             end
       endcase return, period_start
35     end
```

==========================================================

What is claimed is:

1. A method for detecting zero crossings in a rectified power signal comprising three separate signal constituents for energizing a three-phase circuit, said method comprising:

sampling at least two consecutive cycles of each signal constituent at a predetermined sampling rate;

storing a predetermined number of samples for each signal constituent;

computing a respective initial zero crossing estimate for each signal constituent by searching for three consecutive samples in each respective one of the three signal constituents so that a middle sample of the three consecutive samples has a respective sample value which is less than the respective sample values of the two remaining samples and satisfy $$2x(i+1)+\alpha<x(i)+x(i+2),$$

where x(i+1) represents the sample value of the middle sample at time i+1, x(i) and x(i+2) represent sample values for the two remaining samples at time i and i+2, respectively, and $\alpha$ is a predetermined constant; and checking the accuracy of the respective initial zero crossing estimate for each signal constituent.

2. The method for detecting zero crossings in accordance with claim 1 wherein the step of checking the accuracy of each respective initial zero crossing estimate comprises:

setting a respective index being indicative of a respective half cycle start for each of the three signal constituents of the power signal;

assigning respective polarities to the stored samples based on the index setting being indicative of each respective half cycle start for each of the three signal constituents;

adding the polarized samples for each of the three signal constituents; and comparing the sum of the polarized samples against a predetermined threshold parameter.

3. A method for detecting zero crossings in a rectified power signal comprising three separate signal constituents for energizing a three-phase circuit, said method comprising:

sampling at least two consecutive cycles of each signal constituent at a predetermined sampling rate;

storing a predetermined number of samples for each signal constituent;

computing a respective initial zero crossing estimate for each signal constituent;

checking the accuracy of the respective initial zero crossing estimate for each signal constituent;

selecting the initial zero crossing estimate having the smallest sample value in each of the three signal constituents;

reversing the index setting being indicative of the half cycle start for the signal constituent corresponding to the selected zero crossing estimate having the smallest sample value;

reassigning respective polarities to the stored samples based on the reversed index setting;

adding the polarized samples for each of the three signal constituents of the power signal; and comparing the sum of the polarized samples against said predetermined threshold parameter.

4. The method for detecting zero crossings in accordance with claim 3 and further comprising adjusting the initial estimate for the zero crossing in an additional one of the three signal constituents.

5. The method for detecting zero crossings in accordance with claim 4 wherein the step of adjusting the initial estimate for the zero crossing in the additional one of the three signal constituents comprises:

restoring the original index setting being indicative of the half cycle start for the signal constituent corresponding to the selected zero crossing estimate having the smallest sample value;

selecting the initial zero crossing estimate having the second smallest value in each of the three signal constituents of the power signal;

reversing the index setting being indicative of the half cycle start for the signal constituent corresponding to the selected zero crossing estimate having the second smallest value;

reassigning respective polarities to the stored samples based on the last reversed index setting;

adding the polarized samples for each of the three signal constituents of the power signal; and comparing the sum of the polarized samples against said threshold parameter.

6. The method for detecting zero crossings in accordance with claim 5 and further comprising the step of declaring a ground fault condition in said three phase circuit based on the comparison step performed while adjusting the initial estimate for the zero crossing in the additional one of the three signal constituents of the power signal.

7. The method for detecting zero crossings in accordance with claim 5 wherein said predetermined threshold parameter comprises a programmable threshold parameter.

8. A method for sensing zero crossings in a rectified power signal comprising three separate signal constituents for energizing a three-phase circuit and for using the sensed zero crossings for detecting a ground fault in said three phase circuit, said method comprising:

sampling at least two consecutive cycles of each signal constituent at a predetermined sampling rate;

storing a predetermined number of samples for each signal constituent;

computing a respective initial zero crossing estimate for each signal constituent;

checking the accuracy of the respective initial zero crossing estimate for each signal constituent; and adjusting the initial estimate for the zero crossing of at least one of the three signal constituents of the power signal by:

selecting the initial zero crossing estimate having the smallest sample value in each of the three signal constituents of the power signal;

reversing the index setting being indicative of the half cycle start for the signal constituent corresponding to the selected zero crossing estimate having the smallest sample value;

reassigning respective polarities to the stored samples based on the reversed index setting;

adding the polarized samples for each of the three signal constituents of the power signal to supply a second sum; and storing said second sum.

9. The method for sensing zero crossings in accordance with claim 8 wherein the step of computing each respective initial zero crossing estimate comprises:

searching for three consecutive samples in each respective one of the three signal constituents so that a middle sample of the three consecutive samples has a respective sample value which is less than the respective sample values of the two remaining samples and satisfy $$2x(i+1)+\alpha < x(i)+x(i+2),$$

where $x(i+1)$ represents the sample value of the middle sample at time $i+1$, $x(i)$ and $x(i+2)$ represent sample values for the two remaining samples at times $i$ and $i+2$, respectively, and $\alpha$ is a predetermined constant.

10. The method for sensing zero crossings in accordance with claim 9 wherein the step of checking the accuracy of each respective initial zero crossing estimate comprises:

setting a respective index being indicative of a respective half cycle start for each of the three signal constituents of the power signal;

assigning respective polarities to the stored samples based on the index setting being indicative of each respective half cycle start for each of the three signal constituents of the power signal;

adding the polarized samples for each of the three signal constituents of the power signal to supply a first sum; and storing said first sum.

11. The method for sensing zero crossings in accordance with claim 8 and further comprising adjusting the initial estimate for the zero crossing in an additional one of the three signal constituents of the power signal by:

restoring the original index setting being indicative of the half cycle start for the signal constituent corresponding to the selected zero crossing estimate having the smallest sample value;

selecting the initial zero crossing estimate having the second smallest value in each of the three signal constituents of the power signal;

reversing the index setting being indicative of the half cycle start for the signal constituent corresponding to the selected zero crossing estimate having the second smallest value;

reassigning respective polarities to the stored samples based on the last reversed index setting;

adding the polarized samples for each of the three signal constituents of the power signal to supply a third sum;

storing said third sum;

selecting the stored sum having the lowest value of the three stored sums; and comparing the selected stored sum against a predetermined ground fault threshold indicator.

12. The method for sensing zero crossings in accordance with claim 11 wherein said ground fault condition in said three phase circuit is detected based on the comparison of the selected stored sum against the predetermined ground fault threshold indicator.

* * * * *